(12) United States Patent
Zyss et al.

(10) Patent No.: US 7,450,237 B2
(45) Date of Patent: Nov. 11, 2008

(54) NON-INVASIVE ELECTRIC-FILED-DETECTION DEVICE AND METHOD

(75) Inventors: Joseph Zyss, Sceaux (FR); Timothee Pol Jean Toury, Tournes (FR)

(73) Assignees: Centre National de la Reccherche Scientifique CNRS, Paris Cedex (FR); Ecole Normale Superieure de Cachan, Cachan Cedex (FR)

( * ) Notice: Subject to any disclaimer, the term of this patent is extended or adjusted under 35 U.S.C. 154(b) by 161 days.

(21) Appl. No.: 10/568,859

(22) PCT Filed: Aug. 18, 2004

(86) PCT No.: PCT/FR2004/002159

§ 371 (c)(1),
(2), (4) Date: Feb. 21, 2006

(87) PCT Pub. No.: WO2005/022179

PCT Pub. Date: Mar. 10, 2005

(65) Prior Publication Data

US 2008/0007248 A1      Jan. 10, 2008

(30) Foreign Application Priority Data

Aug. 22, 2003    (FR) .................................... 03 10115

(51) Int. Cl.
*G01B 9/02* (2006.01)

(52) U.S. Cl. .................................... 356/450

(58) Field of Classification Search ................ 356/35.5, 356/450, 484, 491; 324/76.36, 76.37
See application file for complete search history.

(56) References Cited

U.S. PATENT DOCUMENTS

| | | | |
|---|---|---|---|
| 5,394,098 A | 2/1995 | Meyrueix et al. |
| 5,872,360 A | 2/1999 | Paniccia et al. |
| 6,072,179 A | 6/2000 | Paniccia et al. |
| 6,271,671 B1 | 8/2001 | Charles, Jr. et al. |

(Continued)

FOREIGN PATENT DOCUMENTS

EP      0 480 205 A2      4/1992

(Continued)

OTHER PUBLICATIONS

Chemelik R., "Holographic Confocal Microscopy," 12th Czech-Slovak-Polish Optical Conference, Proceedings of SPIE vol. 4356 (2001), pp. 118-123. (XP-008000246).

(Continued)

*Primary Examiner*—Michael A Lyons
(74) *Attorney, Agent, or Firm*—Miller, Matthias & Hull

(57) ABSTRACT

The invention relates to a device which is used for the non-invasive detection of an electric potential or field, of the spatial and/or the temporal derivatives thereof, in a medium with a linear or quadratic electrooptical effect. The inventive device comprises: an optical source which is used to illuminate at least one zone of the medium that is to be probed with a light beam, the path of which defines an optical axis; and means for mapping the phase shift of the beam in the zone to be probed. Measuring means which are used to map the light beam phase shift comprise a confocal microscope in which the zone to be probed is placed in order to form an image of a plane of said zone.

31 Claims, 3 Drawing Sheets

U.S. PATENT DOCUMENTS 6,587,258 B1 7/2003 Kane
6,803,777 B2* 10/2004 Pfaff et al. .................. 324/752
7,206,078 B2* 4/2007 Pfaff et al. .................. 356/517

FOREIGN PATENT DOCUMENTS

WO      WO 01/35325 A1    5/2001

OTHER PUBLICATIONS

Chemelik R., "Surface Profilometry by a Holographic Confocal Microscopy," Optica Applicata, vol. XXXIII, No. 2-3, 2003, pp. 381-389. (XP-008030404).

Pudney C. et al., "A 3D Local Energy Surface Detector for Confocal Microscope Images," pp. 7-12, (XP-010295560), 1995.

Martin G. et al., "Reflection Second Harmonic Generation Scanning Microscope," Synthetic Metals, 127, 2002, pp. 105-109. (XP-001189215).

International Search Report PCT/FR2004/002159; report dated Feb. 8, 2005.

* cited by examiner

NON-INVASIVE ELECTRIC-FILED-DETECTION DEVICE AND METHOD

CROSS-REFERENCE TO RELATED APPLICATION

This is the U.S. National Phase of International Application No. PCT/FR2004/02159 filed 18 Aug. 2004, the entire disclosure of which is incorporated herein by reference.

FIELD OF THE INVENTION

The present invention relates to devices and methods for the noninvasive quantitative detection and mapping of an electric field or potential, or spatial and/or temporal derivatives thereof, in an optically active medium, possibly one of known structure. In this document, the expression "optically active medium" is understood to mean a medium exhibiting electrooptic properties and more particularly a medium exhibiting a linear electrooptic effect (or Pockels effect) or a quadratic electrooptic effect, the manifestation threshold of which is however higher than in the linear case, while still remaining compatible with the use of short-pulse power lasers.

In particular, the invention relates to a device comprising:

an optical source for illuminating at least one region of the medium to be probed with a light beam, the path of which defines an optical axis; and means for mapping the phase shift of the light beam, said phase shift being induced by an electric field or potential, or derivatives thereof, in the region to be probed.

BACKGROUND OF THE INVENTION

Document U.S. Pat. No. 5,394,098 describes an example of such a device used for testing optoelectronic components. In this device, the optical source is a laser and the means used for mapping the phase shift of the light beam consist of an interferometer. The medium having electrooptic properties consists of a layer of a suitable polymer covering at least part of the component that it is desired to test.

However, this type of device has the drawback of allowing electric field measurements only on the surface because of the dissociation, inherent in this approach, between firstly the unknown electrooptic medium, which is the target of the measurement and is itself the site of the electric field to be determined (or of the electrooptic distribution to be determined or of a combination of the two) and secondly the artificial electrooptic medium introduced as a means of revealing the field lines emitted by the medium to be probed. Furthermore, the use of this type of device is limited to the detection of electric fields in media that are able to receive treatments of the thin-film deposition type, such as those generally used in the technologies for fabricating optoelectronic components. This type of device cannot be used in particular for detecting electric fields in the volume of biological media.

An object of the present invention is in particular to alleviate these drawbacks.

SUMMARY OF THE INVENTION

For this purpose, the invention provides a device for the noninvasive detection of an electric field or potential, or derivatives thereof, in a medium exhibiting a linear or quadratic electrooptic effect, wherein, apart from the features already mentioned, the means for mapping the phase shift of the light beam comprise a confocal microscope in which the region to be probed is placed in a manner suitable for forming an image of one plane of the region to be probed.

Thanks to the confocal microscope, it is possible to achieve three-dimensional spatial resolution. It is thus possible to probe the volume of the medium. This arrangement makes it possible to probe a medium, without particular preparation if the medium is endowed with electrooptic properties. It is also possible to dope the medium with molecules, ions, etc. having electrooptic properties or conferring electrooptic properties on the medium, so as to accentuate the electrooptic properties of the medium, if the latter is already endowed therewith, or to reveal the presence of electric fields in a medium that does not intrinsically possess such properties.

The nature of the probed media may, thanks to the invention, be highly varied. Apart from the optoelectronic components already mentioned, there may be a local distribution, for example an interface between two different dielectric media each devoid of any intrinsic electrooptic activity. The interface between the two media having individually nonelectrooptic character therefore induces a structural break in centrosymmetry near the discontinuity and the possibility of an electrooptic effect. In another example of a local distribution of the electrooptic properties, the medium is amorphous. For example, it may be a polymer matrix containing a solid solution of randomly dispersed electrooptic molecules that have been locally oriented in a noncentrosymmetric random order, (owing to the effect of an electric field locally induced by a suitable electrode or by optical fields in a configuration called an all-optical orientation, which acts locally at the focus of the orienting beams). Such local occurrences of electrooptic properties may be denoted by either of the following suggestive names: "electrooptic surfaces" (in the case of two-dimensional or quasi-two-dimensional distribution of the membrane type) or "electrooptic islands" (or voxels) in the case of inclusions of electrooptic structures exogenic to the ambient medium. For example, in this case there may be inclusions of electrooptic structures in a film of amorphous polymer devoid of intrinsic electrooptic properties (these inclusions having nanoscale or microscale dimensions, for example nanocrystals having quadratic nonlinear properties). Conversely, it is possible to create, byaxial disorientation, a local defect having an electrooptic effect within an initially homogeneous electrooptic structure (as obtained by quasi-uniform orientation in an electric field in a conventional configuration of the corona needle type). In particular, the invention is useful in two symmetrical situations. Firstly, it makes it possible, when the distribution of the electrooptic properties is unknown, to reveal the spatial mapping of this a priori unknown distribution by applying an electric field with a set of simple electrodes that allows the distribution of the field within the specimen to be controlled as well as possible. Secondly, when the spatial distribution of the electrooptic properties is well known by other means (for example in the case of a technological method for the controlled formation of this distribution), the invention makes it possible to determine the mapping of the internal or external field within the distribution, the latter depending both on this a priori known distribution of the electrooptic properties, but also on the geometry of the electrodes via which an external electric field is applied. In certain intermediate cases, knowledge about both the distribution of the electric field and the electrooptic properties of the structures proves to be limited. The invention then makes it possible for the optical phase shift experienced by the incident wave probing the medium to be mapped with certainty, despite these two unknowns. To make progress in resolving the indeterminacies, a person skilled in the art will therefore propose structural and/or physical hypotheses with respect to either the structure of the electrooptic medium, or the field distribution, or a combination of the two.

Likewise, thanks to the invention, the spatial resolution of the electric field measurement is limited only by the optics used.

In embodiments of the invention, one or more of the following provisions may optionally be furthermore employed:

the means for mapping the phase shift of the light beam comprise an interferometer for splitting the light beam into a reference beam and a probe beam and for measuring the phase shift between the reference beam and the probe beam after the latter has passed through the region to be probed in this interferometer, the servocontrol of the respective path lengths of the reference beam and the probe beam being active up to a cutoff frequency $f_c$ and these mapping means having a signal sampling frequency $f_a$ above the cutoff frequency $f_c$;

the temporal resolution of the electric field detection is limited only by that of the electronics and of the optoelectronic components of the means for mapping the phase shift of the light beam;

it includes means for moving the medium along the three directions in space, in the probe beam;

it includes scanning means suitable for scanning the region to be probed and a reference region with the light beam at an image acquisition frequency $f$ for images recorded by the means for measuring the variations in the phase of the light beam above the cutoff frequency $f_c$;

it includes the scanning means suitable for scanning the region to be probed and the reference region with the light beam along a first direction in space at a frequency $f_x$ and along a second direction in space at a frequency $f_y$, in order to form an image of n pixels along the first direction and m pixels along the second direction, the frequencies $f_x$ and $f_y$ being chosen such that $f_x=f_y/n$ and $f_y=f_a/m$. Thus, the frequency of variation of the signal corresponding to the observed electrooptic phenomenon is modulated at a higher frequency $f_x$ and advantageously a frequency higher than the cutoff frequency $f_c$. More precisely, the scanning means comprise four acoustooptic deflectors, two for deflecting the light beam, upstream of the confocal microscope, each in one of the first and second directions in space respectively, and two for rectifying the light beam, each in one of the first and second directions in space respectively, downstream of the confocal microscope. In fact, these first and second directions in space are perpendicular to the optical axis;

at least one acoustooptic deflector, downstream of the confocal microscope is set so as to make the $0^{th}$-order of the light beam inclined to the optical axis and to retain the paraxial 1st-order; optionally, a Galileo telescope for increasing the angle of deviation between the 1st-order and the optical axis; and it further includes, upstream of the confocal microscope, means for controlling the polarization of the probe beam incident on the region to be probed.

According to another aspect, the invention relates to a method for implementing the device according to the invention. In particular this is a method for the noninvasive detection of an electric field or potential, or derivatives thereof, in a medium exhibiting a linear or second-order electrooptic effect, in which:

at least one region of the medium to be probed is illuminated with an optical source with a light beam whose path defines an optical axis;

the phase shift of the light beam, induced by an electric field or potential, or derivatives thereof, in the region to be probed is mapped;

wherein the region to be probed is placed in a confocal microscope, which is itself inserted in means for mapping the phase shift of the light beam in a manner suitable for forming an image of a plane in the region to be probed.

In ways of implementing the method according to the invention, one or more of the following provisions may optionally also be employed:

knowing the distribution of the electrooptic properties of the medium, the electric field is mapped in the medium; or an electric field of known configuration is generated in the medium so as to reveal electrooptic properties of the medium.

BRIEF DESCRIPTION OF THE DRAWINGS

The invention will also be more clearly understood with the aid of the drawings in which.

In the various figures, the same references denote identical or similar elements.

DESCRIPTION OF PREFERRED EMBODIMENTS

One example of an embodiment of the device according to the invention is presented below in relation to FIGS. 1 and 2.

Figure 1:
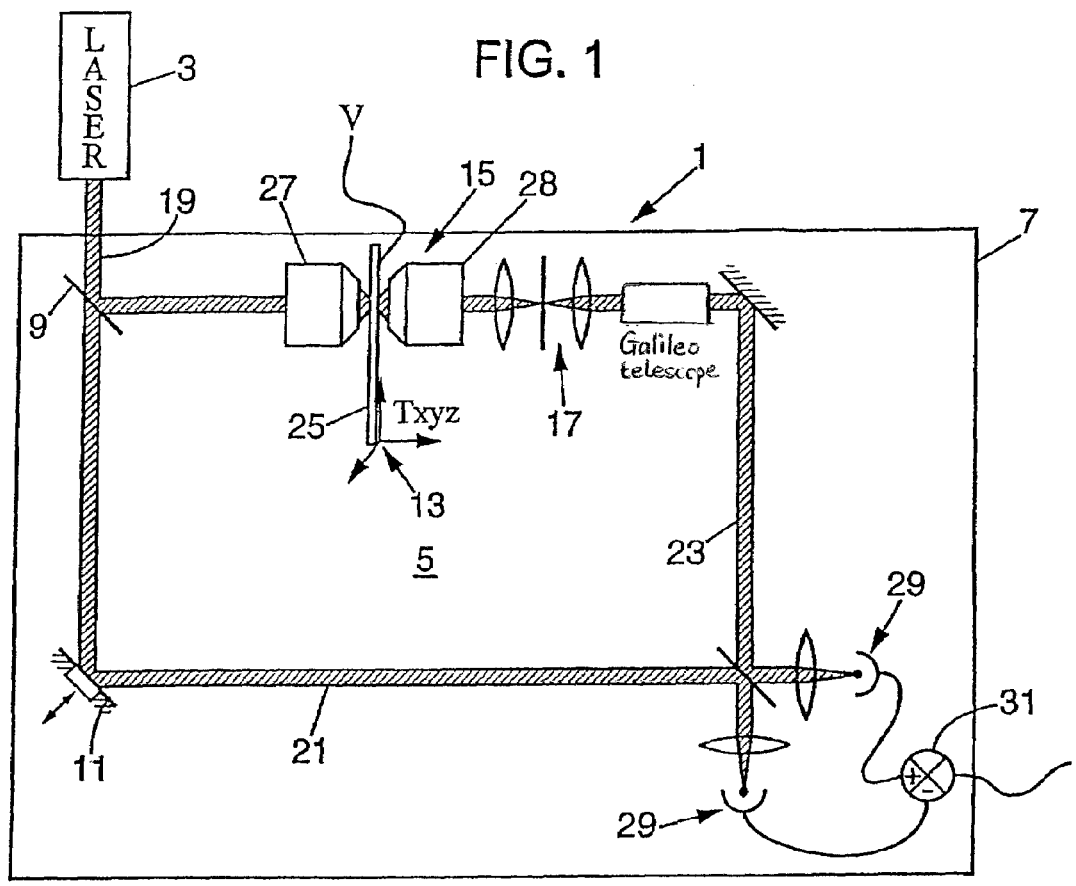
FIG. 1 is a diagram showing the principle of one example of an embodiment of a device according to the present invention.
Figure 3:
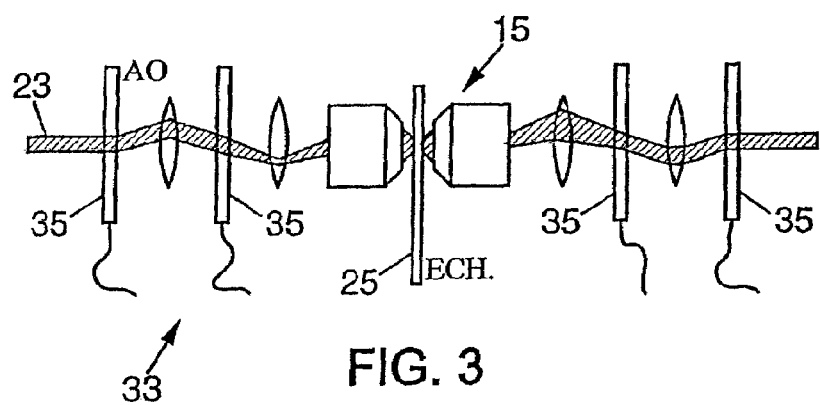
FIG. 3 shows schematically a variant of the device of FIG. 1.

As shown in FIG. 1, this device 1 is a microscope. It comprises an optical source 3 and an interferometer 5 constituting means 7 for mapping the phase shift of the light beam.

The optical source 3 is for example a laser. The wavelength, the power and the nature (pulsed or continuous) of this laser are, of course, tailored to the medium to be probed and more particularly to the optically active species (molecules, ions, electronic material, etc.) that reveals the electric field within this medium. For example, for an application involving the study of optoelectronic components, an He/Ne laser emitting at 632.8 nm with a power of a few milliwatts may be required for use.

The interferometer 5 comprises splitter means 9, for example means consisting of a half-wave plate and a polarizer, servocontrolled mirrors 11, a specimen holder 13, a confocal microscope 15 and optical elements 17. According to the embodiment example of the microscope shown in FIG. 1, the electric fields are detected in transmission mode. Of course, it is also within the competence of a person skilled in the art to transpose this teaching in order to carry out this detection in reflection mode.

The interferometer 5 is mounted in homodyne detection mode. The splitter means 9 split the light beam 19 emitted by the source 3 into a reference beam 21 and a probe beam 23. The quadrature between the reference beam 21 and the probe beam 23 is slaved to $\pi/2$ so as to determine the relative variation in optical path. An example of the servocontrol of the mirrors 11 is given in the doctoral thesis by P. F. Cohadon (Laboratoire Kastler-Brossel, Paris University VI, January 2000).

The probe beam 23 is focused in a region of a specimen 25 mounted in the specimen holder 13 by means of a first optic 27 of the confocal microscope 15. A second optic 28 of the confocal microscope 15 collects the light beam transmitted by the specimen 25 in this region. It should be noted that, in the case of detection in reflection mode, the reflection may optionally take place after the second optic 28. The light beam is then filtered by the optical elements 17 comprising a diaphragm that intercepts the entire signal that does not pass through the focus of the second optic 28.

The specimen 25 is moved in the probe beam 23 by a piezoelectric block that moves the specimen holder 13 in the three directions in space. The specimen 25 is thus probed volumewise. Thanks to the piezoelectric block, it is possible for the electric fields in the specimen 25 to be mapped in three dimensions.

The probe beam 23 is detected and recorded by means 7 for mapping the phase shift of the light beam. More precisely, these means comprise detectors 29 and an electronic processing and servocontrol unit 31.

The detectors 29 are ultrafast high-sensitivity photodiodes such as those described in the aforementioned doctoral thesis of P. F. Cohadon. These detectors 29 are used both for servocontrolling the relative optical path length of the reference beam 21 and the probe beam 23 and for recording the signal transmitted by the specimen 25.

The electronic processing and servocontrol unit 31 is a high-frequency electronic unit known to those skilled in the art.

The device 1 as described above may be used for detecting electric fields whose variations occur at a frequency above the cutoff frequency $f_c$ for servocontrolling the relative path lengths of the reference beam 21 and the probe beam 23. Thus, it may be used for detecting reproducible high-frequency periodic signals. For example, the medium is excited at a frequency $f_e$ and the variation in the phase of the probe beam relative to that of the reference beam is measured at this same frequency $f_e$. Optionally, it is possible to also record the possible responses at other frequencies that can contain information about the noise, possible artifacts or other nonlinear phenomena.

It is thus possible to map the electrical response to an excitation signal at the frequency $f_e$, which is endogenic or exogenic, at any frequency above the cutoff frequency $f_c$.

The device described above may be used in many applications.

As an example, this device may be used in a method according to the invention for testing optoelectronic components.

In the present document, the term "optoelectronic component" is understood to mean an electronic, microelectronic or optronic component, or else a circuit comprising components of at least one of these types. Advantageously, these optoelectronic components exhibit an electrooptic effect, at least in part of the region to be studied and/or mapped.

More particularly, in this type of method, a reproducible periodic excitation potential is created between two electrodes. The region 34 to be probed includes at least one part of an optoelectronic component to which this potential is applied.

Figures 2A, 2B:
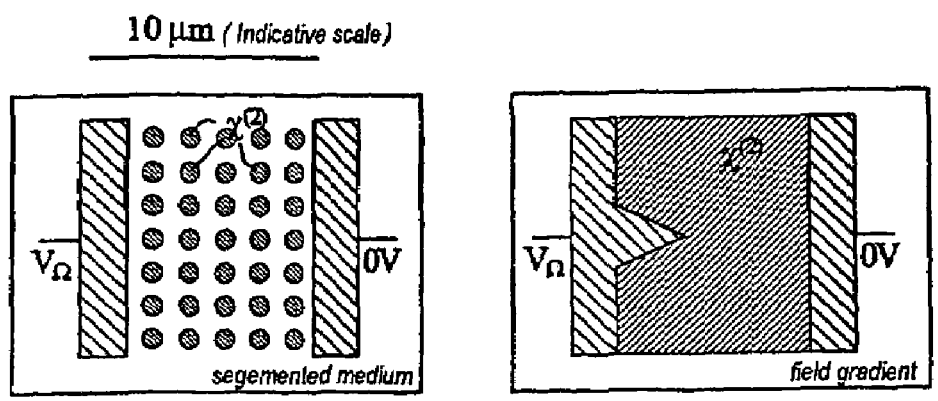
FIGS. 2a to 2f show diagrammatically a few examples of applications of the method according to the invention.

This type of method may be used for studying segmented media (see FIG. 2a). It therefore allows optoelectronic component fabrication processes to be characterized and validated on the micron and/or submicron scales. For example, it is thus possible to measure the resolution of optically active etched regions.

This type of method may also be used for studying electric field gradients, especially by the use of electrodes of non-trivial shape (FIG. 2b). These are for example multipolar electrodes (cf. octupolar geometry as described in the article by J. Zyss, Nonlinear Optics, Vol. 1, page 3, 1991; see also FIG. 2c) via which an electric potential is applied. An electrooptic structure of multipolar symmetry matched to that of the electrodes allows the derivative of the field to be revealed, for example the second derivative of the field at the center of a set of octupolar electrodes, as depicted in FIG. 2b, the field and its first derivative being made zero by the symmetry at the center of the orientation microcell shown diagrammatically therein. It is thus possible, thanks to the method according to the invention, to map electric field gradients or curvatures in optically active regions. These field maps may be compared with calculations for the validation and refining of models or, on the contrary, they make it possible to search for field configurations whose particular properties cannot be easily calculated.

Figures 2C, 2D:
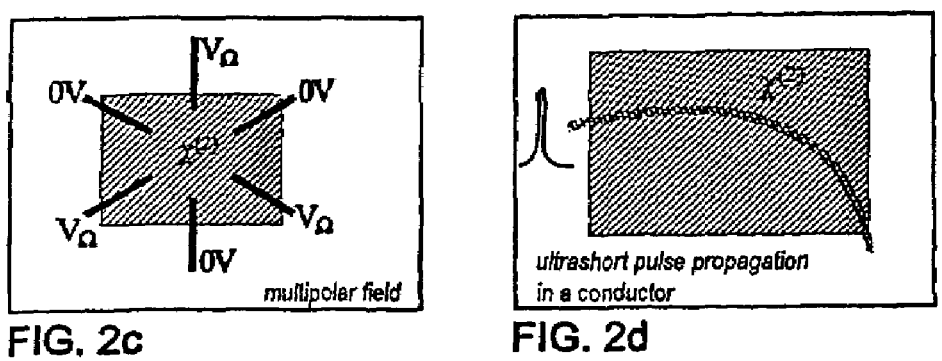
Figures 2E, 2F:
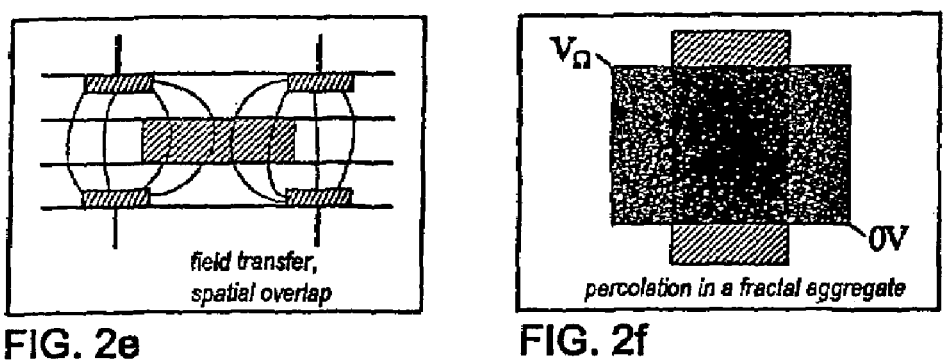

This type of method may also be used for studying multipolar fields (see FIG. 2c). In this case, the potential is applied via at least one electrode with multipolar symmetry. Configurations of electrodes with multipolar symmetry allow multipolar field structures to be examined. Such multipolar field structures make it possible, for example, to understand the orientational distribution of molecules under the influence of these multipolar fields.

In another application of the method according to the invention, the propagation of pulses in a conductor (wire, integrated circuit, optoelectronic component, etc.) may be studied. This conductor is then placed in an optically active medium. By exposing the medium to ultrashort pulses, it is possible to examine, by frequency analysis of the propagation of these pulses in the conductor, ultrashort transient regimes and information about the ohmic resistance of the conductor (see FIG. 2d).

Another application of the method according to the invention is in the study of phenomena such as field transfer, spatial overlap, etc. In optoelectronic components, the field applied between electrodes does not always have a simple form (see FIG. 2e). In particular, field transfer and spatial overlap problems may occur, both in the static case (of the active layer of the component) and in the dynamic case (modulation field). By mapping the electric fields using the method according to the invention, it is possible to optimize the shape and structure of these components, for example so as to result in reduction in the control voltage.

Another application of the method according to the invention is in the study of fractal aggregates, particularly percolation in these aggregates. In the region 34 to be probed there may be at least part of a fractal aggregate (see FIG. 2f).

In a variant of the device 1 described above, this also includes means 33 for scanning the probe beam 23 over the specimen 25.

Figure 4:
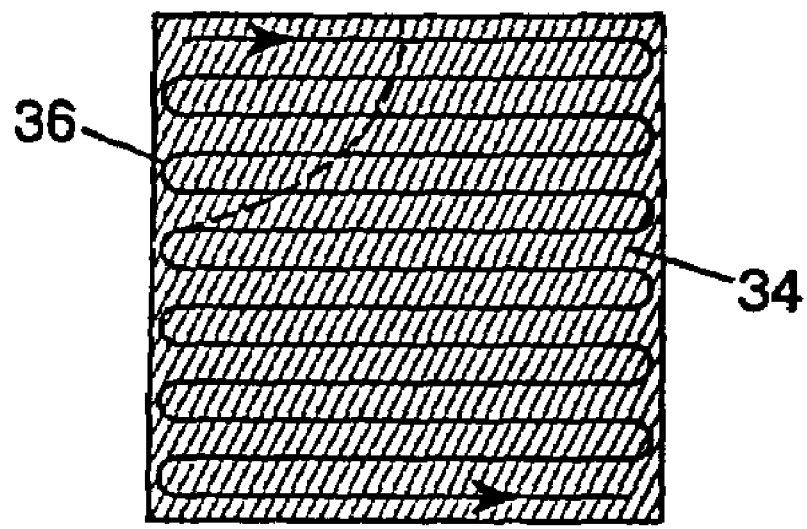
FIG. 4 shows schematically the scanning carried out by the scanning means of the variant shown in FIG. 3.

These scanning means 33 are illustrated in FIG. 4. They comprise four acoustooptic deflectors 35.

Two of these deflectors 35 are placed upstream of the confocal microscope 15 in order to deflect the probe beam 23. These deflectors 35 upstream of the confocal microscope are inclined so as to retain only the 1st-order of the beam parallel to the optical axis. One of these two deflectors causes the specimen 25 to be scanned with the probe beam 23 along a first direction in space, at a frequency $f_x$, which is also the acquisition frequency. The other of these two deflectors causes the specimen 25 to be scanned with the probe beam 23 along a second direction in space, at a frequency $f_y$ (see FIG. 4). An image consisting of n pixels along the first direction and m pixels along the second direction is thus formed. If the signal sampling frequency is $f_a$, the frequencies $f_x$ and $f_y$ are chosen such that $f_x=f_a/n$ and $f_y=f_a/m$, and such that both these are above the cutoff frequency $f_c$.

The other two of the four deflectors 35 are placed downstream of the confocal microscope 15 and allow the probe beam 23 to be rectified, each in one of the first and second directions in space respectively.

The scanning means 33 make it possible to modulate, at the frequency $f_x$ above the cutoff frequency $f_c$, the signal coming from the possible electric fields detected.

As illustrated in FIG. 4, the signal transmitted by the specimen 25 during the scan along the first and second directions is recorded. This scan passes via a region 34 to be probed and a reference region 36. This reference region 36 may be a region of the specimen 25 itself in which the electric fields do not vary. A reference image, that is to say an image of the phase with no potential or with a reference or rest potential, is then subtracted from the image of the signal coming from the possible electric fields detected. The image of this signal coming from the possible detected variations of the electric fields is thus displayed on a black background. This therefore allows synchronous detection by means of which the relatively low-frequency noise is eliminated.

The signal coming from the possible electric fields detected is demodulated in the electronic processing and servocontrol unit 31 in a conventional manner.

The variant described above of the device according to the invention may be used to detect electric fields whose variations occur at a frequency below the cutoff frequency $f_c$ for servocontrolling the relative path length of the reference beam 21 and the probe beam 23. Thus, it may be used for detecting periodic or aperiodic signals that may or may not be transient and may or may not be reproducible.

One particularly useful application of this variant is in the field of biology. In this case, the region 34 to be probed includes at least one part of a natural or artificial biological medium. Specifically, for example, the region 34 to be probed includes at least one part of a natural or artificial biological membrane.

Thus, one application of the method according to the invention is in the study of biomimetic systems, and for example the diffusion of molecular species through artificial membranes. Modifications of these membranes, due to phenomena of various types (chemical, biochemical, electrical, electromagnetic radiation, etc.), may be detected thanks to the device according to the invention. This type of application may extend to the study of microfluidic systems, capsules, vesicles, etc.

The method according to the invention may also be used to study biological systems, such as neurons, animal or plant cells, etc.

For the purpose of studying healthy neurons, the region 34 to be probed includes at least one part of a neuron or of a neural network and the device according to the invention allows the propagation of neural and/or interneuronal electrical signals, the origin of these signals, etc. to be determined. The device according to the invention in this case advantageously replaces the "patch-clamp" techniques for which, for example for a field of observation measuring 10×10 μm², several tens of thousands of electrodes, or more, would have been necessary in order to obtain an equivalent mapping. The device according to the invention also overcomes contact problems, stearic hindrance problems, etc.

The device according to the invention also can be used to study disturbed or pathological neurons, sclerosed neurons, degenerated neurons, etc.

Thanks to the device according to the invention, it is also possible to observe small-scale electrical phenomena, such as overvoltage phenomena or those occurring in oxidation-reduction chemical reactions, in chemical reactors possibly on a nanoscale, in micelles, in humic-clay complexes, etc. The region 34 to be probed therefore constitutes at least one part of a chemical medium.

Figure 5:
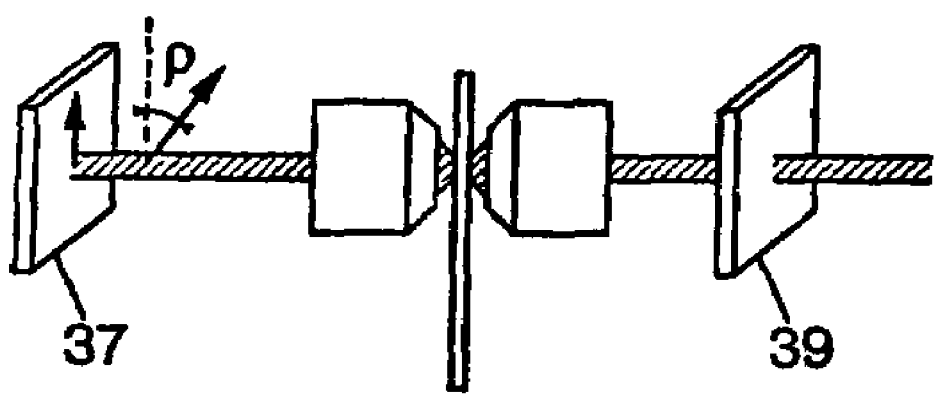
FIG. 5 shows schematically a variant of the devices shown in FIGS. 1 and 3.

In another variant of the device according to the invention, shown in FIG. 5, which may be combined with one and/or the other of the two embodiments already explained, this includes means 37 for controlling the polarization of the probe beam 23. These polarization control means 37 allow the polarization state of the probe beam 23 incident on the specimen 25 to be varied in a controlled manner. For example, these are polarization control means 37 suitable for obtaining a linear polarization of the probe beam 23, the polarization angle ρ of which in the plane transverse to the optical axis can be varied over 360°. Such polarization control means 37 may be formed by any device known to those skilled in the art for the preparation and rotation of a linear polarization state in the plane transverse to the optical axis. In particular, they may comprise a half-wave plate and/or a polarizer.

Such polarization control means 37 are placed upstream of the first optic 27 and scanning means 33. A person skilled in the art is then capable of carrying out the corrective calculations needed to switch the linear polarization state upstream of this first optic 27 to the elliptic polarization state in the specimen 25. An optional polarization analyzer 39 may be placed on the downstream side of the second optic 28, as a complement to the polarization control means 37.

In certain cases, whether in electronics or in biology, the medium must be doped with electrooptic molecules or ions so as to accentuate the electrooptic properties of the medium and/or to allow electric fields to be observed in media that do not have such properties.

As an example of electrooptic molecules, the following molecules may be mentioned:

the molecule "DR1" (Dispersed Red 1) is well known to those skilled in the art. It is used more for studying optoelectronic components and biomimetic systems;

the molecule "Crystal Violet" is also well known to those skilled in the art. It constitutes an example of an octupole. It is sensitive to successive gradients of the electric field and not to the electric field itself. The method according to the present invention is not limited to detecting electric fields with 2nd-order nonlinearities since higher-order nonlinearities may be used; and molecules derived from phthalocyanine by peripheral substitution with electron donor and accepter groups in a non-centrosymmetric geometry are also known to those skilled in the art. They can be used for studying biological systems.

Many other molecules may be used. In particular, molecules having shapes different from those indicated above or derivatives of these molecules may be used.

One embodiment of the scanning means 33 has been described above, but many types of scanning may be envisioned. A few of these may be mentioned:

rectangular scanning: the scanning is carried out over a region of interest, comprising the region to be probed and the reference region, which is smaller than the area effectively accessible. This type of scanning is in particular useful if the region to be probed is small—this may then be profitably used for scanning at a higher frequency with the same resolution, or for increasing the resolution by constricting the pixels or any intermediate solution;

multi-rectangle scanning: the scanning is carried out over a region corresponding to a set of rectangles, such as those described in the previous paragraph. The reference region may be a single region, whereas the various regions to be probed correspond to different rectangles. This may be useful if the region to be probed cannot be covered by a single rectangle;

scanning over areas of various shapes: the scanning is carried out over areas that are circular, elliptical, triangular, etc. or over a composition of these areas;

scanning over complex surfaces: the scanning is carried out over surfaces with complex shapes, as the application requires, for example for studying all or part of an optoelectronic component or of a biological system (neuron, membrane, artificial membrane, for example of the Langmuir-Blodgett film type, etc.); and parameterized scanning: the scanning is carried out along paths with the coordinates x and y parameterized as follows:

$$x = \cos(w.n.t)$$

$$y = \cos(w.n.m.t)$$

in which n and m are substantially the numbers of pixels corresponding to an acquisition period along the x and y coordinates respectively. This type of scanning makes it possible to approach the limits of the acoustooptic modulators as closely as possible. Of course, it is also possible to keep this parameterization only on one of the two coordinates.

It should be noted that the construction of the system for controlling these various types of scanning is known to those skilled in the art.

The invention claimed is:

1. A device for noninvasive detection of an electric field or potential, or derivatives thereof, in a medium exhibiting a linear or second-order electrooptic effect, this device comprising:
    an optical source for illuminating at least one region of the medium to be probed with a light beam, whose path defines an optical axis;
    mapping means for mapping a phase shift of the light beam, said phase shift being induced by an electric field or potential, or derivatives thereof, in the region to be probed,
    wherein the mapping means comprise a confocal microscope in which the region to be probed is placed in a manner suitable for forming an image of one plane of the region to be probed.

2. The device as claimed in claim 1, wherein the mapping means comprise an interferometer for splitting the light beam into a reference beam and a probe beam and for measuring the phase shift between the reference beam and the probe beam after the latter has passed through the region to be probed, in this interferometer, and wherein a photodetection means for photodetecting light together with a processing and servocontrol unit carry out a servocontrol of the respective path lengths of the reference beam and the probe beam being active up to a cutoff frequency $f_c$ and these mapping means having a signal sampling frequency $f_a$ higher than the cutoff frequency $f_c$.

3. The device as claimed in claim 2, which includes moving means for moving the medium in the probe beam along three non-collinear directions in space.

4. The device as claimed in claim 2, which includes scanning means for scanning the region to be probed and a reference region, with the light beam at an acquisition frequency f of images recorded by measuring means for measuring the variations in the phase of the light beam above the cutoff frequency $f_c$.

5. The device as claimed in claim 4, wherein the scanning means scan the region to be probed and the reference region along a first direction in space at a frequency $f_x$ and along a second direction in space at a frequency $f_y$, in order to form an image of n pixels along the first direction and m pixels along the second direction, the frequencies $f_x$ and $f_y$ being chosen such that $f_x = f_y/n$ and $f_y = f_a/m$.

6. The device as claimed in claim 5, wherein the scanning means comprise four acoustooptic deflectors, two for deflecting the light beam, upstream of the confocal microscope, each in one of the first and second directions in space respectively, and two for rectifying the light beam, each in one of the first and second directions in space respectively, downstream of the confocal microscope.

7. The device as claimed in claim 6, wherein at least one acoustooptic deflector, downstream of the confocal microscope is set so as to make $0^{th}$-order of the light beam inclined to the optical axis and to retain paraxial 1st-order.

8. The device as claimed in claim 7, which comprises a Galileo telescope for increasing an angle between the $1^{st}$-order and the optical axis.

9. The device as claimed in claim 1, which further includes, upstream of the confocal microscope, controlling means for controlling a polarization of the probe beam incident on the region to be probed.

10. A method for noninvasive detection of an electric field or potential, or derivatives thereof, in a medium exhibiting a linear or second-order electrooptic effect, in which:
    at least one region of the medium to be probed is illuminated with an optical source with a light beam whose path defines an optical axis;
    a phase shift of the light beam, induced by an electric field or potential, or derivatives thereof, in the at least one region of the medium to be probed is mapped;
    wherein the at least one region of the medium to be probed is placed in a confocal microscope, which is itself inserted in mapping means for mapping the phase shift of the light beam in a manner suitable for forming an image of a plane in the at least one region of the medium to be probed.

11. The method as claimed in claim 10, in which, knowing the electric field is mapped in the medium, from medium electrooptic property distribution.

12. The method as claimed in claim 10, in which an electric field of known configuration is generated in the medium so as to reveal electrooptic properties of the medium.

13. The method as claimed in claim 10, wherein an interferometer is used to split the light beam into a reference beam and a probe beam and to measure a phase shift between the reference beam and the probe beam after the latter has passed through the region to be probed, a photodetection means for photodetecting light together with a processing and servocontrol unit servocontrol respective path lengths of the reference beam and the probe beam and images are acquired by the photodetection means at a signal sampling frequency $f_a$ higher than the cutoff frequency $f_c$ for the servocontrol of the respective path lengths of the reference beam and the probe beam.

14. The method as claimed in claim 13, wherein the medium is moved in the probe beam, along three non-collinear directions in space.

15. The method as claimed in claim 14, wherein the medium is excited at a frequency $f_e$ and the variation in the phase shift between the probe beam and the reference beam is measured at this same frequency $f_e$.

16. The method as claimed in claim 13, wherein the region to be probed and a reference region are scanned with the probe beam at an image acquisition frequency f for images recorded by the means for measuring the variations in the phase of the light beam higher than the cutoff frequency $f_c$.

17. The method as claimed in claim 16, wherein the region to be probed and the reference region are scanned along a first direction in space at a frequency $f_x$ and along a second direction in space at a frequency $f_y$, in order to form an image of n pixels along the first direction and m pixels along the second direction, the frequencies $f_x$ and $f_y$ being chosen such that $f_x=f_y/n$ and $f_y=f_a/m$.

18. The method as claimed in claim 10, wherein at least one acoustooptic deflector downstream of the aufocal telescope is set so as to make 0th-order of the light beam inclined to the optical axis and to retain paraxial $1^{st}$-order.

19. The method as claimed in claim 18, in which an angle between the $1^{st}$-order and the optical axis is increased by means of a Galileo telescope.

20. The method as claimed in claim 10, wherein the region to be probed includes at least one part of an optoelectronic component to which a potential is applied.

21. The method as claimed in claim 20, wherein the potential is applied via at least one electrode, the shape of which is suitable for creating an electric field gradient.

22. The method as claimed in claim 20, wherein the potential is applied via at least one multipolar electrode.

23. The method as claimed in claim 20, wherein the optoelectronic component is placed in an optically active medium.

24. The method as claimed in claim 20, wherein the propagation of an electrical pulse in the optoelectronic component is studied.

25. The method as claimed in claim 10, wherein the region to be probed includes at least one part of a fractal aggregate.

26. The method as claimed in claim 10, wherein the region to be probed includes at least one part of a biological medium.

27. The method as claimed in claim 26, wherein the region to be probed includes at least one part of a biological membrane.

28. The method as claimed in claim 26, wherein the region to be probed includes at least one part of a neuron or of a neural network.

29. The method as claimed in claim 10, wherein the region to be probed includes at least one part of an artificial membrane.

30. The method as claimed in claim 10, wherein the region to be probed constitutes at least one part of a chemical medium.

31. The method as claimed in claim 10, wherein the medium is doped with molecules or ions having electrooptic properties, or conferring electrooptic properties on the medium.

* * * * *